United States Patent [19]

Hutchinson

[11] Patent Number: 4,569,746

[45] Date of Patent: Feb. 11, 1986

[54] MAGNETRON SPUTTER DEVICE USING THE SAME POLE PIECE FOR COUPLING SEPARATE CONFINING MAGNETIC FIELDS TO SEPARATE TARGETS SUBJECT TO SEPARATE DISCHARGES

[75] Inventor: Martin A. Hutchinson, Santa Clara, Calif.

[73] Assignee: Varian Associates, Inc., Palo Alto, Calif.

[21] Appl. No.: 611,434

[22] Filed: May 17, 1984

[51] Int. Cl.[4] .............................. C23C 15/00
[52] U.S. Cl. ...................... 204/298; 204/192 R; 204/192 M
[58] Field of Search ............... 204/298, 192 R

[56] References Cited

U.S. PATENT DOCUMENTS

| | | | |
|---|---|---|---|
| 4,265,729 | 5/1981 | Morrison | 204/298 |
| 4,362,611 | 12/1982 | Logan et al. | 204/298 |
| 4,389,299 | 6/1983 | Adachi et al. | 204/298 |
| 4,392,939 | 7/1983 | Crombeen et al. | 204/298 |
| 4,401,539 | 8/1983 | Abe et al. | 204/192 |
| 4,407,713 | 10/1983 | Zega | 204/298 |
| 4,415,427 | 11/1983 | Hidler et al. | 204/298 |
| 4,422,916 | 12/1983 | McKelvey | 204/298 |
| 4,431,505 | 2/1984 | Morrison | 204/298 |
| 4,434,038 | 2/1984 | Morrison | 204/298 |
| 4,441,974 | 4/1984 | Nishikawa | 204/298 |
| 4,461,688 | 7/1984 | Morrison | 204/298 |

*Primary Examiner*—Arthur P. Demers
*Attorney, Agent, or Firm*—Stanley Z. Cole

[57] ABSTRACT

A magnetron sputter device includes separate first and second targets over which first and second discharges are formed by separate ionizing electric fields and separate confining magnetic fields. The separate confining magnetic fields include first and second magnetic circuits through the first and second targets, respectively. The first magnetic circuit includes first and second pole pieces for coupling magnetic flux from a first magnetic field source to the first target. The second magnetic circuit includes the second pole piece and a third pole piece for coupling magnetic flux from a second magnetic field source to the second target. The magnetic circuits and the magnetic field sources are arranged so that magnetic fluxes from the first and second magnetic field sources combine in the second pole piece.

17 Claims, 6 Drawing Figures

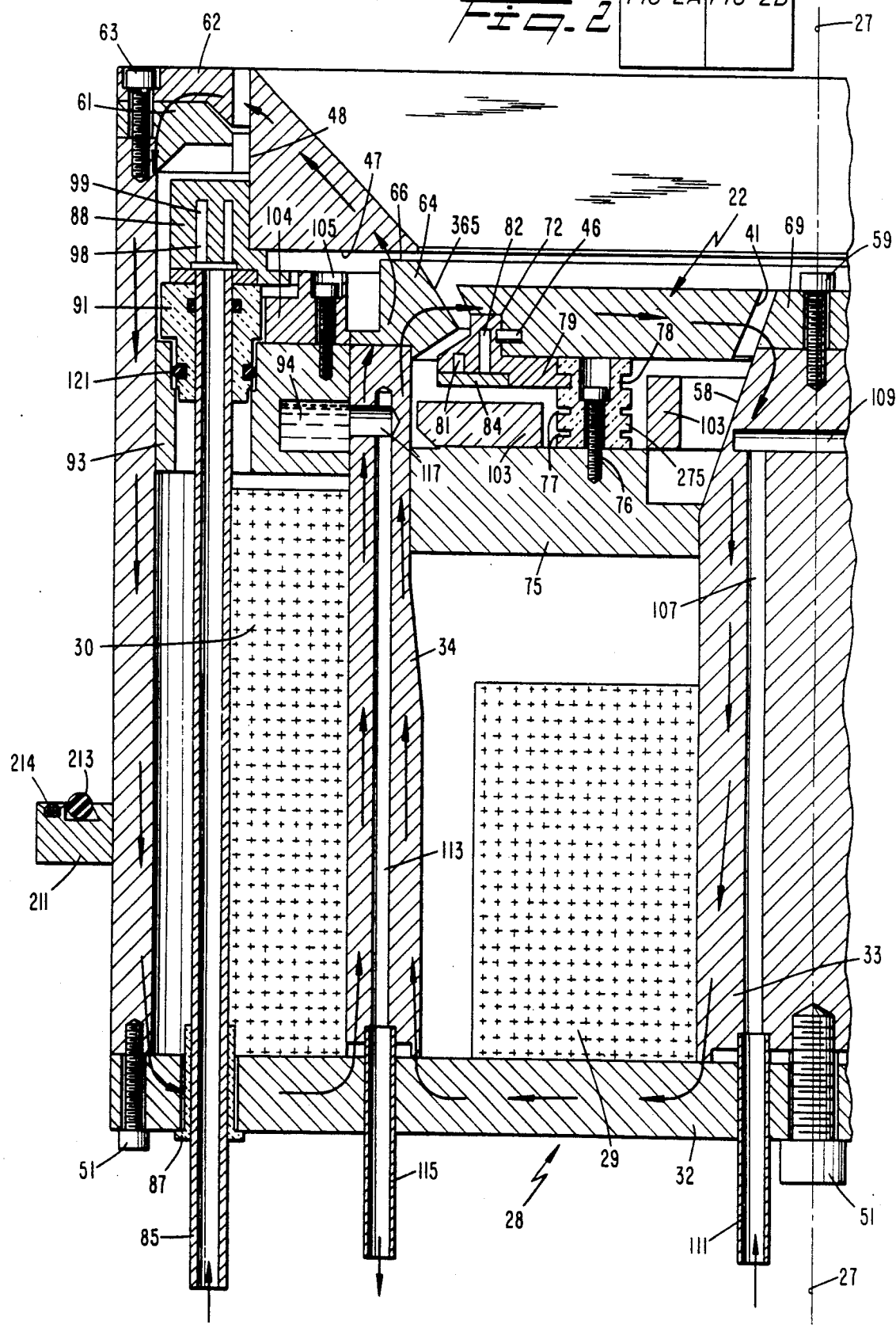

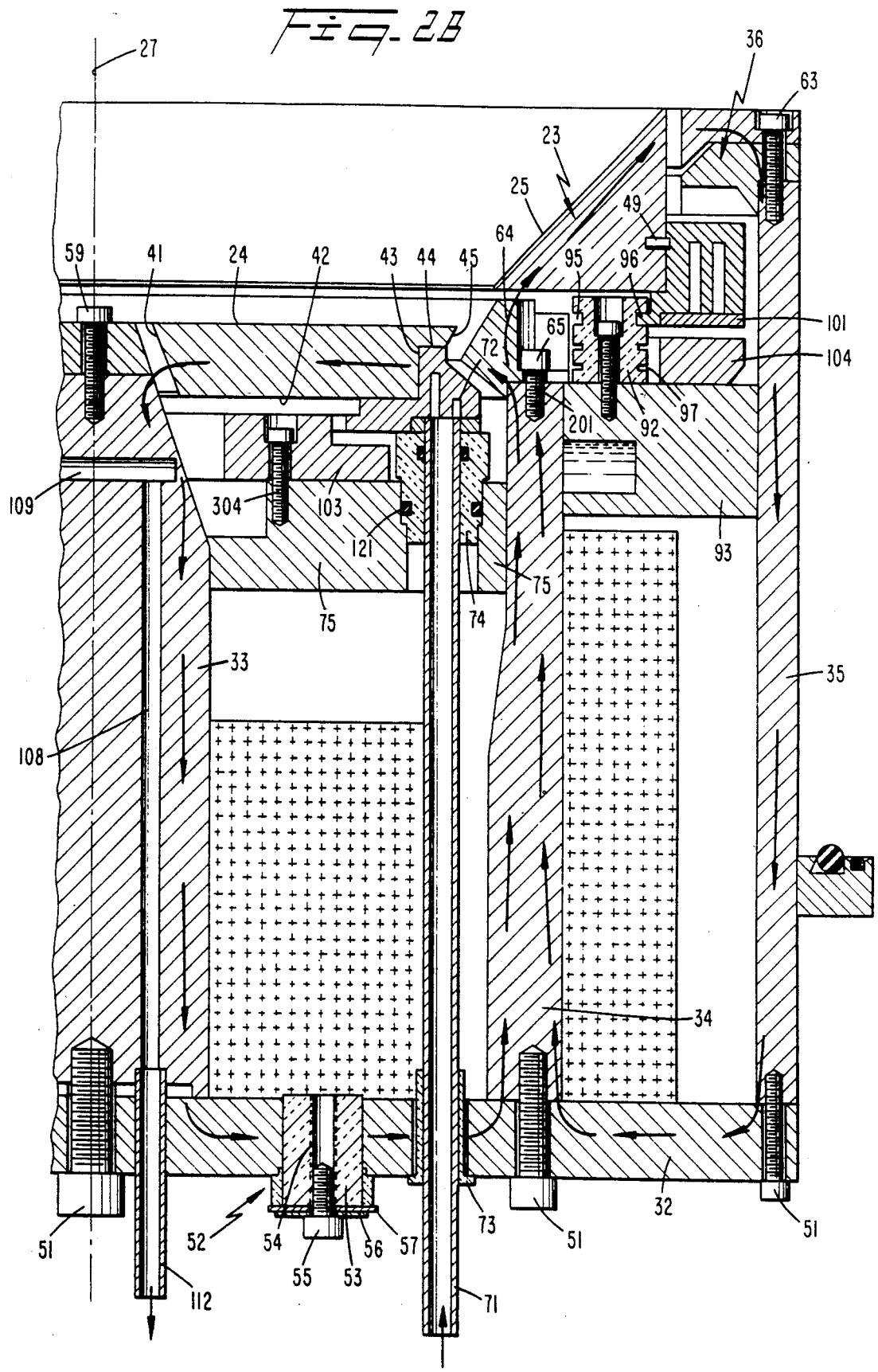

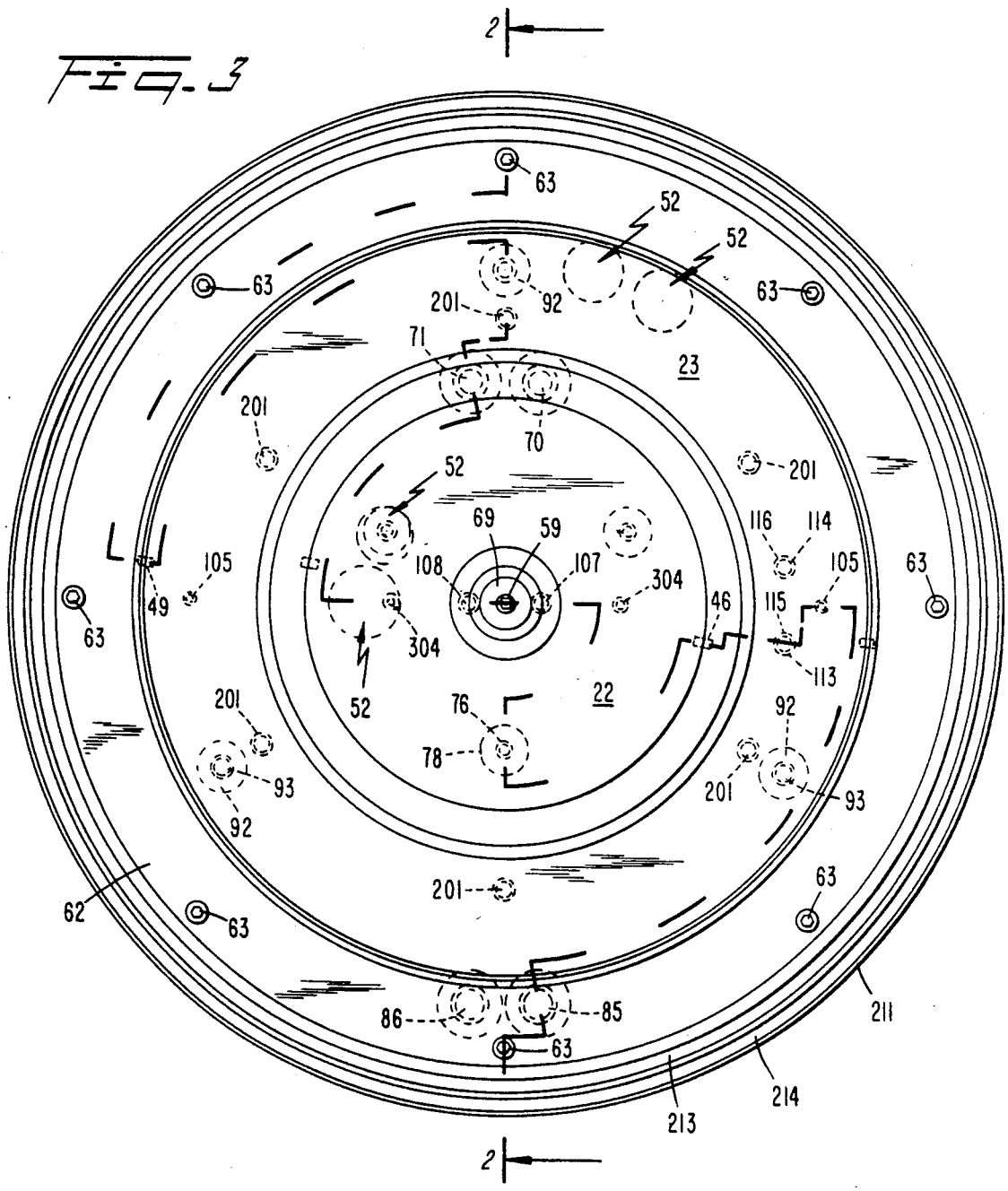

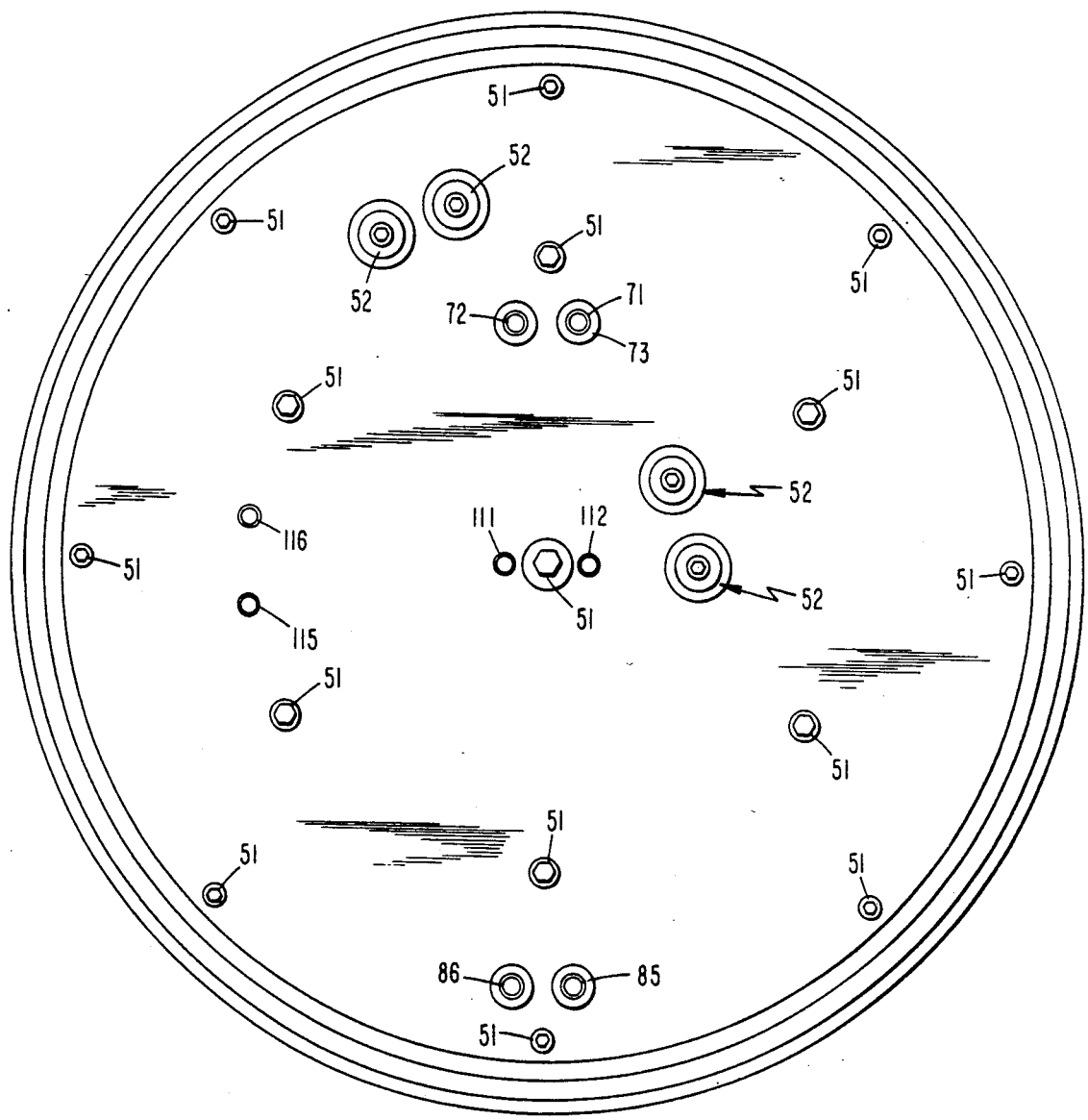

MAGNETRON SPUTTER DEVICE USING THE SAME POLE PIECE FOR COUPLING SEPARATE CONFINING MAGNETIC FIELDS TO SEPARATE TARGETS SUBJECT TO SEPARATE DISCHARGES

TECHNICAL FIELD

The present invention relates generally to magnetron sputter devices and more particularly to a magnetron sputter device having first and second targets responsive to separate first and second discharges confined by separate magnetic circuits having a common pole piece.

BACKGROUND ART

Magnetron sputter devices are characterized by crossed electric and magnetic fields in an evacuated chamber into which an inert, ionizable gas, such as argon, is introduced. The gas is ionized by the electric field. The magnetic field confines the ionized gas, which forms a plasma, in proximity to a target structure which emits atoms that are incident on a workpiece; typically a substrate in a coating process. Generally, the magnetic field is established by a permanent magnet structure, although increasingly electromagnetic devices are being employed for this purpose. In coating applications, the magnetron sputtering devices are frequently employed to deposit metals in the manufacture of electronic, integrated circuit type devices. It is also known to deposit magnetic materials in the manufacture of high density magnetic discs of a type used for magnetic disc memories.

In prior art magnetron sputtering devices, uniform coating thickness across a substrate was obtained by moving the substrates during coating. Moving the substrates also assisted in obtaining step coverage, i.e., conformal coating over step type transitions. Of course there are many problems in moving a substrate during operation of a sputtering device. It is also desirable in certain instances to co-deposit different materials, particularly materials which are difficult or impossible to alloy; thus, materials which are not adapted to being formed as a single target. In the past co-depositing has been performed by moving a substrate relative to several targets, each having a planar configuration. In all instances, it is desirable to operate the sputtering device at as high a rate as possible.

It is desirable for magnetron cathode sputtering devices to be as compact and as light weight as possible. Magnetic flux is more efficiently coupled to targets if the sputter device, particularly the cathode assembly of the sputter device, is maintained compact. Minimizing the volume and weight of the device assists in reducing the costs thereof.

It is, accordingly, an object of the present invention to provide a new and improved magnetron sputtering device wherein material emitted from a relatively large target area is incident uniformly on a large area workpiece.

Another object of the invention is to provide a magnetron sputtering device having relatively high speed operating rate and which is relatively efficient.

An additional object of the invention is to provide a new and improved magnetron sputtering device that is relatively compact, light weight, highly efficient and relatively low cost.

DISCLOSURE OF INVENTION

In accordance with the present invention a magnetron vacuum sputtering device for causing material from a target means to be sputtered onto a workpiece includes a target assembly with first and second targets. An ionizable gas is supplied to a space adapted to be evacuated. The space is between the target assembly and a workpiece on which atoms from the target assembly are to be coated. An ionizing electric field is provided for the gas in the evacuated space by applying a negative bias to the targets. Separate first and second discharges are established in the ionized gas immediately above emitting surfaces of the first and second targets. The separate discharges are formed by means for establishing separate first and second ionizing electric fields for the gas above the first and second targets. Different magnetic fields confine the gas ionized by the electric fields in the vicinity of the emitting surfaces of the first and second targets. The confining magnetic field is formed by first and second magnetic circuits that respectively extend through the first and second targets. The first magnetic circuit includes first and second pole pieces for coupling magnetic flux from a first magnetic field source to the first target. The second magnetic circuit includes the second pole piece and a third pole piece for coupling magnetic flux from a second magnetic field source to the second target. The magnetic circuits and the magnetic field sources are arranged so that magnetic fluxes from the first and second magnetic field sources combine to produce a net flux in the second pole piece.

In the preferred embodiment, the emitting surfaces of the first and second targets are respectively planar and concave, with the concave surface being configured as a side wall of a frustum of a cone. The pole pieces of the first and second magnetic circuits are arranged to cause lines of magnetic flux in close proximity to the planar and concave surfaces to subsist generally parallel to the planar and concave surfaces. The planar emitting surface has an annular configuration with inner and outer radii of $R_1$ and $R_2$, respectively, while the concave emitting surface is symmetrical about a longitudinal axis of the annular planar emitting surfaces and has inner and outer radii of $R_3$ and $R_4$, wherein $R_1 < R_2 < R_3 < R_4$. The magnetic circits are arranged so that lines of magnetic flux which cross a boundary of the first target in proximity to radius $R_1$ also cross a boundary of the first target in proximity to radius $R_2$, while magnetic lines of flux that cross a boundary of the second target in proximity to radius $R_3$ also cross a boundary of the second target in proximity to radius $R_4$.

The resulting magnetic field relationship enables the plasma to be contained above the target surface, to center the target erosion pattern on the target surface. Because the magnetic field lines intercept the target, i.e., cross a target boundary at a low angle, the magnetic field is as uniform as possible over the target surface. Thereby, the plasma density is maintained very uniform over the target surface. It is important to maintain the plasma density uniform over the target surface to optimize erosion of material from the target and thereby increase the density of plasma adjacent the target. Because the target density is relatively uniform over a large area of the target, instead of being concentrated in the center of the target, the erosion profile is maintained relatively broad, to obviate a shadow effect which would result from a concentrated plasma density, which causes the erosion profile to be "V" shaped.

The positions of the first and second targets and the distance of the substrate from the targets, and the relative magnitudes of the magnetic fields are adjusted to provide relatively uniform deposition on a substrate of a given diameter. In the described preferred embodiment six inch diameter substrates are typically coated to a uniform thickness of ±5%.

In the preferred embodiment, the magnetic fields through the first and second targets are established by first and second solenoidal magnetic field sources concentric with the disc shaped planar target. The first and second solenoidal magnetic field sources have radii respectively close to and removed from the axis of the disc. A central pole piece extends in the direction of the disc axis to couple magnetic flux from the first magnetic field source to the first target and the vicinity of the planar emitting surface. An intermediate pole piece extends in the direction of the axis for coupling (a) magnetic flux from the first magnetic field source radially through the first target and in proximity to the planar emitting surface so magnetic flux from the first source crosses a boundary of the planar emitting surface in the vicinity of the outer diameter of the emitting surface and (b) magnetic flux from the second source flows through the second target and in proximity to the concave emitting surface thereof. The magnetic fluxes from the two sources are oppositely directed in the intermediate pole piece.

An outer pole piece extending in the direction of the disc axis couples magnetic flux from the second source radially through the second target and in proximity to the concave emitting surface. The pole pieces have radii such that the radius of the intermediate pole piece is greater than that of the central pole piece and is less than the outer pole piece. The outer pole piece includes, at one end thereof proximate the second target, a segment extending radially inward toward the second target for causing magnetic flux to flow radially of the second target.

The first target has outwardly tapered interior walls and inwardly tapered exterior walls. The central pole piece has an outer wall facing the interior wall of the first target. The intermediate pole piece has an inner wall facing the first target exterior wall. Facing segments of the central pole piece outer wall and the first target interior wall have the same taper so they are equidistant through a substantial extent of the first target along the longitudinal axis. Facing segments of the intermediate pole piece inner wall and the target exterior wall have the same taper so they are also equidistant through a substantial extent of the first target along the longitudinal axis. The second target has a flat face generally parallel to the planar emitting surface. The intermediate pole piece has a flat face opposite from and parallel to the face of the second target. Maintaining constant spacing between these parts minimizes high voltage discharges to prolong the life of the device.

In accordance with a further aspect of the invention, the first and second targets are cooled. The cooling means includes block means having surfaces conforming with and abutting against surfaces of the targets from which material is not sputtered. Cooling fluid is supplied to the block means so that heat is transferred between the cooling fluid, the block means and the targets. The block means and cooling fluid supply means are metal and are mechanically and electrically connected. Electric terminal means on the cooling fluid supply means couples electric current to the targets via the metal cooling fluid supply means and the block means.

The abutting relationship of the targets and cooling blocks is such that as the targets expand during operation there is more intimate contact and a very tight connection between the targets and cooling block means. There is a resulting increase in the transfer of heat between the targets and cooling block means during operation of the sputter device. The cooling block means includes first and second cooling rings respectively abutting against the first and second targets. Each of the rings has an annular channel connected to the cooling fluid supply means for receiving the cooling fluid and circulating it through the ring. Each of the rings has a pair of intersecting faces conforming with and abutting against intersecting faces of the targets from which material is not sputtered.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

FIGS. 2A and 2B are cross-sectional views of a target assembly, including a magnetic circuit and cooling structure, taken along the lines 2—2, FIG. 3, in accordance with a preferred embodiment of the present invention; and FIGS. 3 and 4 are respectively top and bottom views of the assembly illustrated in FIG. 2.

BEST MODE FOR CARRYING OUT THE INVENTION

Figure 1:
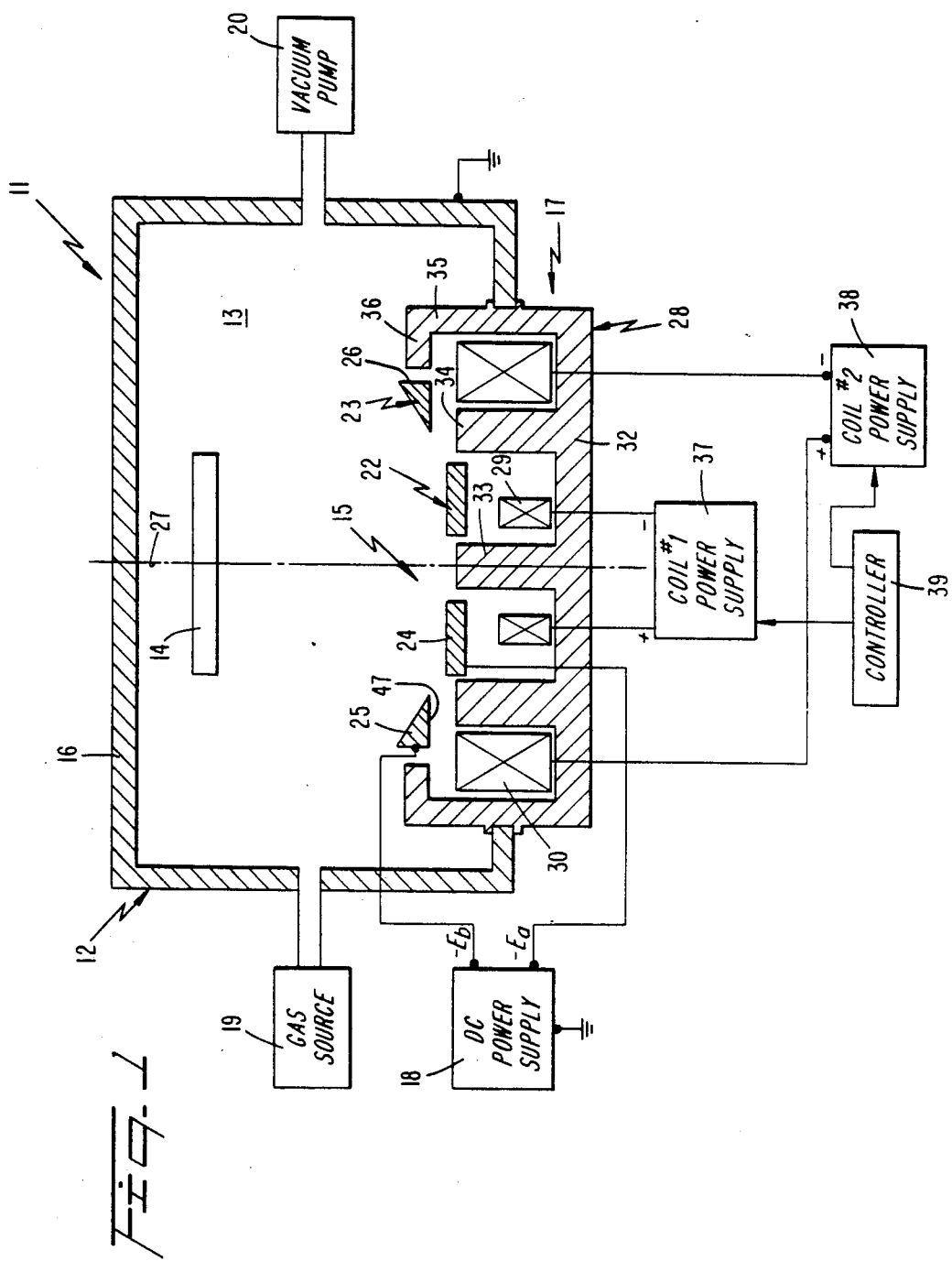
FIG. 1 is a schematic diagram of a sputtering device in accordance with a preferred embodiment of the present invention.
Figure 5:
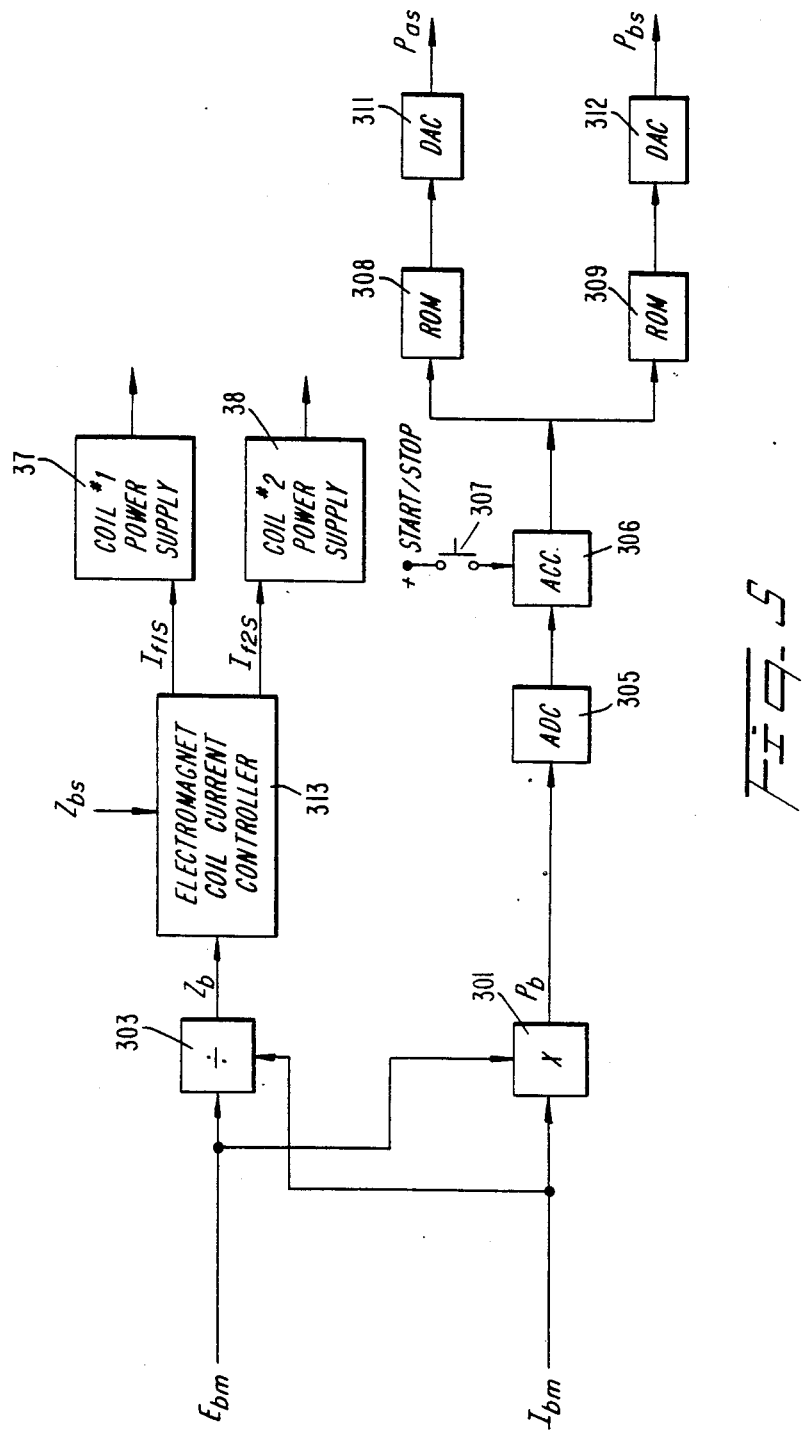

Reference is now made to the schematic diagram, FIG. 1, wherein magnetron sputtering apparatus 11 is illustrated as including vacuum chamber 12, containing enclosed sputter coating processing or depositing volume 13 in which workpiece 14 is fixedly mounted by conventional means (not shown). Typically, substrate 14 is part of an integrated circuit having a relatively larger diameter, such as four to six inches, on which material is deposited for electrical interconnection by subsequent removal of selected areas of the deposited material. In such a situation non-magnetic material is usually deposited on the substrate.

It is to be understood, however, that the invention is applicable to depositing magnetic materials on substrate 14 to form devices such as magnetic disc memories. Certain modifications of the specific structure described in connection with FIGS. 2-4, however, are generally necessary to provide optimum results for deposition of magnetic materials. Each target for sputtering magnetic materials includes a relatively thin magnetic strip mounted on a non-magnetic, metallic holder. The magnetic portion is relatively thin, between one-quarter and one-half inch, so magnetic field lines are not affected materially by them. The magnetic material is saturated to minimize the effect thereof on the magnetic flux flowing through it. Layers of different materials can be deposited on substrate 14 by the apparatus illustrated in FIG. 1, by suitable choice of target materials for cathode assembly 15.

Chamber 12 includes metallic, electrically conducting and grounded exterior housing 16. Housing 16 is a part of an anode assembly and is generally formed as a cylinder having an axis concentric with substrate 14, in turn coaxial with target cathode assembly 15. Targets in cathode assembly 15 are maintained at negative high voltage potentials relative to ground by DC power supply 18.

To establish a plasma in processing volume 13 in the vicinity of cathode assembly 15, an inert gas, typically argon, is supplied to the processing volume from pressurized inert gas source 19. The processing volume is evacuated by vacuum pump 20. The combination of gas source 19 and vacuum pump 20 maintains processing volume 13 at a relatively low pressure, such as 7 millitorr.

Cathode assembly 15 includes two target elements 22 and 23, respectively having planar, annular atom emitting surface 24 and concave atom emitting surface 25, shaped as a side wall of frustum of a cone having a base 47 at right angles to the longitudinal axis of disc shaped target element 22. Surface 25 is inclined throughout its length at an angle of 45° relative to base 47. Target elements 22 and 23 are concentric to each other, having coincident axes along axis 27 of substrate 14. The particular configurations of target elements 22 and 23 are described in detail infra, in connection with FIGS. 2-4.

Separate plasma discharges are established and confined over target elements 22 and 23. The separate discharges are confined by separate, variable magnetic fields coupled to target elements 22 and 23 by magnetic (preferably iron) pole piece assembly 28 in response to magnetic fields derived from toroidal electromagnets 29 and 30. Pole piece assembly 28 and coils 29 and 30 are axially symmetric with and concentric to axis 27, with coil 30 being located outside of coil 29.

Pole piece assembly 28 includes disc shaped base 32, disposed at right angles with respect to axis 27, in combination with central stud 33, and rings 34 and 35. Stud 33 extends along axis 27, while rings 34 and 35 are concentric with axis 27, with the stud and each ring extending longitudinally from base 32 towards substrate 14. Stud 33 is centrally located, in a cylindrical space within coil 29, while ring 34 extends between coils 29 and 30. Ring 35 is outside of coil 30 and target element 23. Ring 35 includes inwardly directed flange 36, at right angles to axis 27. Ring 34 is proximate the outer diameter of annular target element 22 and a lower face of target element 23, while central stud 33 is proximate the inner diameter of target element 22.

Separate, independently controlled currents are supplied to electromagnet coils 29 and 30 by DC power supplies 37 and 38, respectively. Power supplies 37 and 38 are separately controlled in response to signals derived from controller 39 so that as target elements 22 and 23 erode during use, the currents supplied to coils 29 and 30 change to maintain the discharge impedances relatively constant.

To establish the separate discharges, DC power supply 18 maintains target elements 22 and 23 at different negative DC high voltage levels $-E_a$ and $-E_b$, respectively. The detailed structures of pole piece assembly 28 and for supplying DC power to target elements 22 and 23 are described infra in connection with FIGS. 2-4.

In general, the DC currents supplied to coils 29 and 30 and the construction of pole piece assembly 28 establish magnetic flux lines in target element 22 which intersect emitting surface 24 and pass in a first generally vertical direction, e.g. upwardly, through the boundary of annular emitting surface 24 in proximity to the outer diameter of the emitting surface. The same flux lines pass in a second generally vertical direction, e.g. downwardly, through emitting surface 24 in proximity to the inner radius of the emitting surface. Similarly, the flux lines which pass through emitting surface 25 toward axis 27 in proximity to the inner radius of the emitting surface also pass back into target element 23 at the outer radius of the target element. Thereby, separate plasma discharges are contained above the emitting surfaces 24 and 25 and the erosion profiles of target elements 22 and 23 are centered on the emitting surfaces of the targets. The angle between the magnetic field lines traversing the boundaries defined by surfaces 24 and 25 is maintained very low by the magnetic pole assembly 28 so that the magnetic field is very uniform over emitting surfaces 24 and 25. It is important to maintain the plasma density as uniform as possible immediately over emitting surfaces 24 and 25 to provide uniform erosion from the emitting surfaces, and thereby minimize the tendency for a "V" erosion profile which induces target self-shadowing by emitted material. Self-shadowing is a phenomenon whereby material emitted or sputtered from the target collects on the target and has a tendency to prevent escape of further material from the target toward the substrate.

The magnetic field coupled by coil 29 to pole piece assembly 28 causes magnetic flux to flow through a first magnetic circuit. The flux in the first magnetic circuit flows axially along ring 34, thence axially and radially through target element 22 and slightly above emitting surface 24 thereof. From target element 22 and the space immediately above emitting surface 24, the magnetic flux flows axially and radially to stud 33, thence axially along stud 33 to base 32. In base 32, the first magnetic circuit is completed by the flux flowing radialy back to ring 34.

The magnetic flux established by electromagnet 30 flows through a second magnetic circuit. The flux in the second magnetic circuit flows axially through ring 34, thence radially into target element 23. The magnetic flux flows in target element 23 and slightly above emitting surface 25 thereof, thence into ring 35. In ring 35, the magnetic flux flows axially back to base 32, where it flows radially inwardly to ring 34 to complete the second magnetic circuit. Windings of electromagnets 29 and 30 and the arrangements of pole pieces 33, 34 and 35 are such that the magnetic fluxes from electromagnets 29 and 30 are combined in pole piece 34.

If target elements 22 and 23 are magnetic, sufficient current is supplied by power supplies 37 and 38 to electromagnets 29 and 30 to saturate the magnetic targets so that fringing fields subsist above the targets to confine the plasma immediately above emitting surfaces 22 and 23.

Targets 22 and 23 are located relative to each other and spaced from substrate 14 to enable material to be coated uniformly across the surface of the substrate. The relative sputter rates from surfaces 24 and 25 are adjusted during the lives of targets 22 and 23 by controlling power supplies 37 and 38 to maintain uniform deposition on different ones of substrates 14 as emitting surfaces 24 and 25 of targets 22 and 23 erode.

Target elements 22 and 23, as well as pole piece assembly 28, are cooled, in a manner described infra in detail, in connection with FIGS. 2-4. The same structure which cools target elements 22 and 23 supplies DC operating voltages from supply 18 to them. The structures which supply cooling fluid to pole piece assembly 28 also assist in supporting the pole piece assembly.

Reference is now made to FIGS. 2-4 of the drawing, wherein there are illustrated detailed views of cathode assembly 15. It is noted from a comparison of FIGS. 2 and 3 that the cross-sectional view of FIG. 2 is along a rather circuitous path indicated by the dotted line 2—2, FIG. 3; such a cross-sectional view enables the most important features of cathode assembly 15 to be most clearly illustrated.

Disc like target element 22, in addition to including planar, annular emitting surface 24, includes tapered interior radius 41 that flares outwardly from axis 27 as it extends in a generally longitudinal direction of target 22 toward planar face 42, opposite from and parallel to emitting face 24. The outer perimeter of target 22 includes an axially extending segment 43 which intersects face 42, as well as radially extending rim 44, which is disposed parallel to surfaces 24 and 42. Extending generally axially between surface 24 and rim 44 is beveled surface 45. On axially extending wall segment 43 are two diametrically opposed holes 46, each of which receives a non-magnetic pin to assist in holding target element 22 in situ; preferably the pins in cut-out segments 46 are formed of a beryllium-copper alloy.

Target element 23 is formed as a ring having concave emitting surface 25, in combination with base 47 and cylindrical side wall 48. Base 47 and side wall 48 are respectively at right angles to and parallel with axis 27. Concave emitting surface 25 is formed as a wall of a frustum of a cone that is inclined 45° with respect to base 47 and wall 48 throughout the length of the surface. A short second base 26 is disposed between the top edge of face 25 most remote from axis 27 and side wall 48. Diametrically opposed holes 49 in side wall 48 receive non-magnetic beryllium-copper alloy pins to hold target element 23 in situ.

Target elements 22 and 23 are arranged so that the outer radius of planar annular emitting surface 24, having a radius $R_2$, is less than the inner radius $R_3$, of inclined emitting surface 25. Of course, the outer radius $R_4$ of emitting surface 25 is greater than radius $R_3$, and the inner radius, $R_1$, of surface 24 is less than radius $R_2$.

As ilustrated in FIGS. 2, pole piece assembly 28 includes several individual structures whereby central pole piece stud 33, intermediate pole piece ring 34 and outer pole piece ring 35 are mounted on and secured to base 32 by screws 51. Coils 29 and 30 are mounted on base 32, with current being supplied to the coils from supplies 37 and 38 by identical feedthrough assemblies 52.

As illustrated in FIG. 2, one of assemblies 52 includes electric insulating sleeve 53 having a relatively thick metallic coating 54 on the interior wall thereof into which is threaded metal screw 55 that bears against metal flat washer 56. A terminal lug (not shown) is connected to a lead between the head of screw 55 and washer 56 to a terminal of power supply 37. To electrically insulate the lug from the remainder of the sputtering device, dielectric washer 57 is interposed between washer 56 and the top face of sleeve 53.

To assist in providing the desired magnetic field shape, central pole piece stud 33 is cylindrically shaped, having an upward, inwardly inclined segment that is capped by magnetic metallic (preferably magnetic stainless steel) pole piece insert 69. Upper portion 58 of studs 33 and insert 69 are both inclined with respect to axis 27 by the same angle as the inclination angle of inner surface 41 of target 22. As a result, there is a constant spacing between portion 58 and insert 69 to assist in preventing penetration of plasma and sputtered metal into the underside of the source. Cap 58 is held in situ on stud 33 by non-magnetic, preferably austenitic stainless steel screw 59.

Ring 34 includes upper and lower segments, having walls parallel to axis 27, and a central segment with an interior wall that is inclined outwardly with respect to axis 27. Magnetic field saturation in the lower portion of ring 34 is avoided because of the relatively large cross sectional area presented by it to the magnetic flux flowing through it.

Ring 35 has walls of constant thickness throughout substantially the entire length thereof. At the upper end of ring 35 is inwardly extending flange 36, formed of two separate abutting metallic elements, namely exterior magnetic pole piece insert 61 and outer, nonmagnetic, pole piece shield 62, held in situ by metal non-magnetic, preferably austenitic stainless steel screw 63. The interior faces of insert 61 and shield 62 are spaced from outer wall 48 of target 23, whereby a gap having a constant separation between the target and pole pieces is established.

To couple magnetic flux from intermediate ring 34 to both of targets 22 and 23, middle pole piece insert 64 is mounted by metal non-magnetic, preferably austenitic stainless steel, screws 65 on the top face of the intermediate ring. Pole piece 64 is configured to provide a constant gap between it and the opposing faces 45 and 47 of targets 22 and 23. To this end, pole piece insert 64 includes an outwardly tapered inner cylindrical like wall 365 which extends from a plane below the plane of target face 24 to the top of the pole piece insert. The top of pole piece 64 is defined by planar annulus 66, disposed parallel to bottom face 47 of target 23. Face 66 extends radially outward from axis 27 from a point just outside of the intersection of emitting surface 25 and planar surface 47 of target 23 to a point approximately one-quarter of the length of face 47 in the radial direction. The geometry provides a constant gap between pole piece insert 64 and each of targets 22 and 23.

Target cathodes 22 and 23 are maintained at different high voltage negative potentials relative to grounded pole piece assembly 28, with target 22 being maintained at a voltage of $-E_a$ and target 23 being maintained at a potential of $-E_b$. In the presence of plasma, electric lines of force exist along surfaces 24 and 25 of targets 22 and 23, respectively, as well as in the previously mentioned gaps between targets 22 and 23 and the adjacent pole piece elements, namely central pole piece insert 69 on central pole piece 33, middle pole piece insert 64, and outer pole piece insert 61 and shield 62.

Target 22 is supplied with a voltage of $-E_a$ by axially extending metal, non-magnetic (preferably copper) tube 71 which is mechanically and electrically connected to metal, non-magnetic (preferably copper) ring 72, having an axis coincident with axis 27. Ring 72 also supports the underneath side of target 22 by abutting against intersecting horizontally and vertically extending faces 42 and 43 of the target. Small cut-outs provided in ring 72 act as a bayonet mount, which holds target 22 in situ using pins mounted in holes 46. Ring 72 and face 42 abut against each other through a distance of approximately one-quarter of the radius of face 42, between the outer edge of target 22, toward the center thereof.

Tube 71 passes through base 32, but is electrically insulated from it by virtue of axially extending, dielectric sleeve 73. The end of tube 71 proximate ring 72 is supported by sleeve like, dielectric spacer 74, in turn supported by metal, non-magnetic, preferably stainless steel, bulk head 75 which extends radially between and is connected to central pole piece 33 and intermediate pole piece 34. A clamp (not shown) fits over copper tube 71 and is connected to a lead, in turn connected to voltage terminal $E_a$ of DC power supply 18.

A portion of target 22 on the opposite side of axis 27 is supported by dielectric stud 275, having an axial bore into which non-magnetic, metal screw 76 is threaded; screw 76 extends into a threaded bore in bulk head 75 to hold stud 275 in situ. Stud 275 is provided with radially extending, axially spaced slots 77 which assist in preventing electric breakdown between the stud and adjacent metallic parts. Slots 77 have a high flow impedance to metal particles from targets 22 and 23, to prevent migration of the metal into the slots and thus preserve the electric insulating properties of the stud. Stud 275 includes a further radially extending slot 78 in which is captured horizontally extending support shoulder 79 for the bottom face of ring 72. From the foregoing, target 22 is supported mechanically and electrically maintained at a potential of $-E_a$ and is electrically isolated from ground and target 23 by the same structure.

The support structure for target 22 also enables the target to be cooled. To this end, ring 72 is provided with a pair of annular, axially extending slots 81 and 82, in fluid communication with the interior of tube 71. A cooling fluid, preferably water, supplied to the interior of tube 71 flows into slots 81 and 82 to cool the entire circumference of ring 72. Slots 81 and 82 extend around virtually the entire extent of ring 72. Water in slots 81 and 82 flows out of the slots through copper tube 70, FIG. 3, adjacent tube 71. Annular gasket 84, mounted on the bottom face of copper ring 72, covers slots 81 and 82, except where the slots are connected to tubes 71 and 70, to provide a fluid tight seal between the slots and the remainder of the device. Tube 70 extends through base 32 in the same manner as tube 71 and is electrically isolated from the base by a sleeve identical to sleeve 73.

Target 23, electrically connected to supply source voltage $-E_b$, is mechanically supported and cooled in a manner similar to that described for target 22. In particular, target 23 is electrically connected to axially extending copper tubes 85 and 86, which extend through base 32 and are electrically insulated from the base by dielectric sleeves 87, identical to sleeve 73. Current from copper tube 85 flows into ring 88, which abuts against and holds intersecting cylindrical wall 48 and planar face 47 of target 23. Ring 88 includes small bayonet cut-outs for receiving the same non-magnetic pins which engage holes 49, to hold target 23 in situ. Ring 88 is mechanically supported and electrically insulated from the remainder of the device by axially extending dielectric sleeve 91 and stud 92.

Sleeve 91 has a central bore through which copper tube 85 extends. Sleeve 91 includes shoulders which abut downwardly against metal, non-magnetic, preferably stainless steel, bulk head 93 that extends radially between and is mechanically connected to intermediate pole piece 34 and outer pole piece 35.

Along the interior wall of bulk head 93 is an annular channel 94 through which cooling fluid is circulated, as described infra. Ring support stud 92 includes a radial slot 95 which receives and carries inwardly extending flange 96 of copper ring 88. Stud 92 also includes radially extending slots 97 which perform the same function as similar slots 77 and stud 275.

To cool target 23, ring 88 is provided with a pair of annular, axially extending slots 98 and 99, in fluid communication with the interior of tubes 85 and 86. Slots 98 and 99 extend virtually around the entire extent of ring 88 in the same manner as described for slots 81 and 82 in ring 72. A fluid seal is provided for slots 98 and 99 by annular gasket 101, which abuts against and extends radially along the lower face of ring 88 except in the region where slots 98 and 99 are connected to the interior of tubes 85 and 86.

To prevent plasma and sputtered metal from penetrating into the gap between high voltage targets 22 and 23 and the surrounding, electrically grounded parts of cathode assembly 15, metal, non-magnetic, preferably aluminum, annular spacers 103 and 104 are provided. Inner spacer 103 is mounted on and secured to bulk head 75 by metal, non-magnetic screws 304. Spacer 103 extends radially from a region slightly outside of central pole piece 33 to a region slightly inside of intermediate pole piece 34. Spacer 104 is mounted on and secured to bulk head 93 by screws 105. Spacer 104 extends radially from a position aligned with the outer wall of intermediate pole piece 34 to a position just inside of the interior wall of pole piece 35. A constant gap subsists between spacers 103 and 104 and the adjoining metal parts to minimize high voltatge discharges and thereby prolong the life of the unit.

To maximize efficiency, pole piece assembly 28 and the target assembly including target elements 22 and 23 are cooled. To cool the pole piece assembly 28, central pole piece 33 includes axially and radially extending bores 107, 108 and 109. Radially extending bore 109 is in proximity to the top of pole piece 33, proximate target 22. Bores 107 and 108 are connected to a water supply and water sump by way of tubes 111 and 112 which extend through base 32. To cool pole piece 34, it includes axially extending bores 113 and 114, respectively connected to tubes 115 and 116 which extend through base 32 to a water supply and sump. At the end of bore 113 adjacent bulk head 93 is outwardly extending passage 117 through which cooling fluid flows between bore 113 and annular fluid passage 94. Thereby, cooling fluid flows circumferentially about the perimeter of pole piece 34, to cool the pole piece. It has been found that it is not necessary to cool outer pole piece 35 because of the large exposed area thereof and because of its remoteness from the center of cathode assembly 15.

In operation, targets 22 and 23 expand with heating from the discharge power dissipated as material is sputtered from them. Expansion of targets 22 and 23 results in more intimate contact between the targets and support rings 72 and 88. Thereby, tight contacts are made between targets 22 and 23 and rings 72 and 88, to provide better heat transfer between the targets and rings and thereby increase cooling efficiency in transferring heat from the targets to the rings.

Vacuum integrity is maintained in the space above targets 23 and 24, as well as in the region where the plasma discharge is confined between cathode assembly 15 and substrate 14 with bulk heads 75 and 93. All elements which fit through the bulk heads are sealed to walls within the bulk heads by O-rings 121; for example, insulating sleeves 74 and 91 are respectively sealed to bulk heads 75 and 93 by O-rings 121.

Cathode assembly 15 is secured to chamber 16 by axially displaced, radially extending mounting flange 211, fixedly mounted on the exterior side wall of pole piece 35. To provide the proper seal, flange 211 includes a slot for carrying O-ring 213. Rf shield 214 is located in a further slot in flange 211.

While there has been described and illustrated one specific embodiment of the invention, it will be clear that variations in the details of the embodiment specifically illustrated and described may be made without departing from the true spirit and scope of the invention as defined in the appended claims. For example, the DC plasma excitation fields can be replaced by RF fields and target 22 may not have a planar emitting surface.

I claim:

1. A vacuum sputtering device for causing material from a target means to be sputtered onto a workpiece, the target means including separate first and second targets, the device comprising means for supplying an ionizable gas to a space adapted to be evacuated, the space being between the target and workpiece, means for establishing separate first and second discharges in the ionized gas immediately above emitting surfaces of the first and second targets, said separate discharge establishing means including: means for establishing separate first and second ionizing electric fields for the gas above the first and second targets, respectively, and means for establishing different confining magnetic fields for the gas ionized by the electric fields in the vicinity of the emitting surfaces of the first and second targets, said magnetic field confining means including firs and second magnetic circuits through the first and second targets, respectively, the first magnetic circuit including first and second pole pieces for coupling magnetic flux from a first magnetic field source to the first target, the second magnetic circuit including said second pole piece and a third pole piece for coupling magnetic flux from a second magnetic field source to the second target, the magnetic circuits and the magnetic field sources being arranged so that magnetic fluxes from the first and second magnetic field sources combine in the second pole piece, and means for mounting the targets so that emitted material is sputtered from an emitting surface of the second target outside of the first target at an angle displaced from an emitting surface of the first target.

2. The device of claim 1 further including means for adjusting the relative magnitudes of the first and second magnetic fields.

3. The device of claim 1 wherein the emitting surfaces of the first and second targets are respectively planar and concave, the concave surface being configured as a side wall of a frustum of a cone, the pole pieces being arranged to cause lines of magnetic flux in close proximity to the planar and concave surfaces to subsist generally parallel to the planar and concave surfaces.

4. The device of claim 3 wherein the planar emitting surface has an annular configuration with inner and outer radii of $R_1$ and $R_2$, respectively, the concave emitting surface being symmetrical about an axis transverse to the annular planar emitting surface and having inner and outer radii of $R_3$ and $R_4$, wherein $R_1 < R_2 < R_3 < R_4$, and the pole pieces are arranged to cause lines of magnetic flux that cross a boundary of the first target in proximity to radius $R_1$ also to cross a boundary of the first target in proximity to radius $R_2$ and magnetic lines of flux that cross a boundary of the second target in proximity to radius $R_3$ also to cross a boundary of the second target in proximity to radius $R_4$.

5. The device of claim 4 wherein the first and second magnetic field sources respectively include first and second toroidal magnetic field sources concentric with the transverse axis and having radii respectively close to and removed from the transverse axis, the first pole piece comprising a central pole piece extending along the transverse axis for coupling magnetic flux from the first source to the first target and the vicinity of the planar emitting surface, the second pole piece comprising an intermediate pole piece extending in the direction of the transverse axis for coupling (a) magnetic flux from the first source radially through the first target and in proximity to the planar emitting surface so magnetic flux rom the first source crosses a boundary of the planar emitting surface in the vicinity of the outer diameter of the planar emitting surface, and (b) magnetic flux from the second source flows through the second target and in proximity to the concave emitting surface, the magnetic fluxes from the first and second sources being combined in the intermediate pole piece, the third pole piece comprising an outer pole piece extending in the direction of the transverse axis for coupling magnetic flux from the second source radially through the second target and in proximity to the concave emitting surface, the pole pieces having radii such that the radius of the intermediate pole piece is greater that that of the central pole piece and is less than that of the outer pole piece.

6. The device of claim 5 wherein the outer pole piece includes, at one end thereof proximate the second target, a segment extending radially inward toward the second target for causing magnetic flux to flow radially of the second target, the first target having outwardly tapered interior walls and inwardly tapered exterior walls, the central pole piece having an outer wall facing the interior wall, the intermediate pole piece having an inner wall facing the exterior wall, facing segments of the outer and interior walls having the same taper so they are equidistant through a substantial extent of the first target along the transverse axis, facing segments of the inner and exterior walls having the same taper so they are equidistant through a substantial extent of the first target along the transverse axis, the second target having a flat face generally parallel to the planar emitting surface, the intermediate pole piece having a flat face opposite from and parallel to the face of the second target.

7. The device of claim 3 wherein the first target is a disc having an axis, the concave surface being symmetrical about and concentric with the disc axis, first and second toroidal magnetic field sources concentric with the disc axis having radii respectively close to and removed from the disc axis, the first pole piece comprising a central pole piece extending along the disc axis for coupling magnetic flux from the first source to the first target and the vicinity of the planar emitting surface, the second pole piece comprising an intermediate pole piece extending in the direction of the disc axis for coupling (a) magnetic flux from the first source radially through the first target and in proximity to the planar emitting surface so magnetic flux from the first source crosses a boundary of the planar emitting surface in the vicinity of the outer diameter of the planar emitting surface, and (b) magnetic flux from the second source flows through the second target and in proximity to the concave emitting surface, the magnetic fluxes from the first and second sources being combined in the intermediate pole piece, the third pole piece comprising an outer pole piece extending in the direction of the disc axis for coupling magnetic flux from the second source radially through the second target and in proximity to the concave emitting surface, the pole pieces having radii such that the radius of the intermediate pole piece is greater than that of the central pole piece and is less than that of the outer pole piece.

8. The device of claim 7 wherein the outer pole piece includes at one end thereof proximate the second target a segment extending radially inward toward the second target for causing magnetic flux to flow radially of the second target, the first target having outwardly tapered interior walls and inwardly tapered exterior walls, the central pole piece having an outer wall facing the interior wall, the intermediate pole piece having an inner wall facing the exterior wall, facing segments of the outer and interior walls having the same taper so they are equidistant through a substantial extent of the first target along the transverse axis, facing segments of the inner and exterior walls having the same taper so they are equidistant through a substantial extent of the first target along the transverse axis, the second target having a flat face generally parallel to the planar emitting surface, the intermediate pole piece having a flat face opposite from and parallel to the face of the second target.

9. The device of claim 1 wherein the concave surface is configured as a side wall of a frustum of a cone, the planar emitting surface having an annular configuration with inner and outer radii of $R_1$ and $R_2$, respectively, the concave emitting surface being symmetrical about a longitudinal axis of the annular planar emitting surface and having inner and outer radii of $R_3$ and $R_4$, wherein $R_1 < R_2 < R_3 < R_4$, the pole pieces being arranged to cause lines of magnetic flux that cross a boundary of the first target in proximity to radius $R_1$ also to cross a boundary of the first target in proximity to radius $R_2$ and magnetic lines of flux that cross a boundary of the second target in proximity to radius $R_3$ also to cross a boundary of the second target in proximity to radius $R_4$.

10. The device of claim 9 wherein the first and second magnetic field sources respectively include first and second toroidal magnetic field sources concentric with the transverse axis and having radii respectively close to and removed from the transverse axis, the first pole piece comprising a central pole piece extending along the transverse axis for coupling magnetic flux from the first source to the first target and the vicinity of the planar emitting surface, the second pole piece comprising an intermediate pole piece extending in the direction of the transverse axis for coupling (a) magnetic flux from the first source radially through the first target and in proximity to the planar emitting surface so magnetic flux from the first source crosses a boundary of the planar emitting surface in the vicinity of the outer diameter of the planar emitting surface, and (b) magnetic flux from the second source flows through the second target and in proximity to the concave emitting surface, the magnetic fluxes from the first and second sources being combined in the intermediate pole piece, the third pole piece comprising an outer pole piece extending in the direction of the longitudinal axis for coupling magnetic flux from the second source radially through the second target and in proximity to the concave emitting surface, the pole pieces having radii such that the radius of the intermediate pole piece is greater than that of the central pole piece and is less than that of the outer pole piece.

11. The device of claim 10 wherein the outer pole piece includes at one end thereof proximate the second target a segment extending radially toward the second target for causing magnetic flux to flow radially of the second target, the first target having outwardly tapered interior walls and inwardly tapered exterior walls, the central pole piece having an outer wall facing the interior wall, the intermediate pole piece having an inner wall facing the exterior wall, facing segments of the outer and interior walls having the same taper so they are equidistant through a substantial extent of the first target along the transverse axis, facing segments of the inner and exterior walls having the same taper so they are equidistant through a substantial extent of the first target along the longitudinal axis, the second target having a flat face generally parallel to the planar emitting surface, the intermediate pole piece having a flat face opposite from and parallel to the face of the second target.

12. The device of claim 1 further including means for cooling the first and second targets.

13. The apparatus of claim 12 wherein the first and second targets have surfaces from which material is no sputtered, the cooling means including block means having surfaces conforming with and abutting against the targets surfaces from which material is not sputtered, and means for supplying cooling fluid to the block means so that heat is transferred between the cooling fluid, the block means and targets.

14. The device of claim 13 wherein the block means and cooling fluid supply means are metal and are mechanically and electrically connected, and electric terminal means on the cooling fluid supply means for coupling electric current to the target via the metal cooling fluid supply means and the block means.

15. The device of claim 13 wherein the abutting relationship of the targets and cooling blocks is such that as the targets expand in response to heating during operation there is more intimate contact and a tighter seal between the targets and cooling block means to increase the transfer of heat between the targets and cooling block means.

16. The device of claim 15 wherein the cooling block means includes first and second cooling rings respectively abutting against the first and second targets, each of the rings having an annular channel connected to the cooling fluid supply means for receiving the cooling fluid and circulating it through the ring.

17. The device of claim 16 wherein each target has a pair of intersecting faces from which material is not sputtered, each of the rings having a pair of intersecting faces conforming with and abutting against the intersecting faces of the targets.

* * * * *